(12) United States Patent
Gao

(10) Patent No.: US 11,317,543 B1
(45) Date of Patent: Apr. 26, 2022

(54) HIGH POWER DENSITY BASED TWO PHASE SYSTEM DESIGN

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 17/108,735

(22) Filed: Dec. 1, 2020

(51) Int. Cl.
*H05K 7/20* (2006.01)
*F28D 15/02* (2006.01)

(52) U.S. Cl.
CPC ..... *H05K 7/20818* (2013.01); *F28D 15/0266* (2013.01); *H05K 7/20318* (2013.01); *H05K 7/20381* (2013.01); *H05K 7/20827* (2013.01); *H05K 7/20836* (2013.01)

(58) Field of Classification Search
CPC .......... H05K 7/20318; H05K 7/20381; H05K 7/20818; H05K 7/20827; H05K 7/20836; F28D 15/0266
See application file for complete search history.

(56) References Cited

U.S. PATENT DOCUMENTS

| 8,567,486 | B1 * | 10/2013 | Wolf, Sr. | ............ F28D 15/0266 165/274 |
| 11,076,505 | B2 * | 7/2021 | Gao | ........................ H05K 7/203 |
| 2007/0193721 | A1 * | 8/2007 | Tilton | ..................... F25B 43/04 165/104.19 |
| 2021/0153392 | A1 * | 5/2021 | Gao | ................... H05K 7/20745 |

FOREIGN PATENT DOCUMENTS

EP  2816881 B1 * 10/2018 .............. F25B 43/00

\* cited by examiner

*Primary Examiner* — Robert J Hoffberg
(74) *Attorney, Agent, or Firm* — Womble Bond Dickinson (US) LLP

(57) ABSTRACT

A cooling system can include an input channel from which a fluid enters the cooling system and an output channel from which the fluid exits the cooling system. The cooling system can include a vapor buffer and a liquid buffer, and the connections between the two buffers. Vapor buffer valves arranged in fluid channels of the cooling system can be controlled to, in a first mode, disconnect the vapor buffer from an input channel, and, in a second mode, connect the vapor buffer to the input channel and disconnect the vapor buffer from the input of the condenser or the port that is attachable to the input of the condenser.

20 Claims, 9 Drawing Sheets

HIGH POWER DENSITY BASED TWO PHASE SYSTEM DESIGN

FIELD

Embodiments of the present disclosure relate generally to a cooling system for data center or information technology (IT) equipment. The cooling system can utilize phase change of a fluid for cooling.

BACKGROUND

Information Technology (IT) includes technology such as computers that are accessible through the internet or a local network, which provide storage of, or access to, data, websites, computer programs, and more. It is critical to maintain the thermal environment that is required for various IT equipment (e.g., servers, power supplies, etc.). Management of thermal requirements can be especially important and challenging for a high power density rack, because if not cooled properly, an unacceptable amount of thermal energy can build up in a short amount of time and cause damage to the system.

In a two-phase cooling system, a cooling fluid changes phase (e.g., from liquid to vapor or from vapor to liquid) to extract latent thermal energy from a thermal energy source (e.g., IT equipment). Using a two-phase cooling system can be efficient, however, the control of such a cooling system may be critical and challenging due to the properties of phase change. Temperature is a poor feedback parameter because changes in latent thermal energy do not necessarily change temperature. Further, variations such as workload of IT equipment and/or condenser capabilities may impact evaporation and condensation rate of a cooling fluid significantly. Pressure and flow rate of a cooling fluid are both difficult to measure and use as a control parameter.

Variation of thermal load can vary between IT equipment. Further, the same IT equipment can also have varying thermal load depending on time of day, active services that are being performed, etc. Thus, there is a need for a cooling system that can handle large variations in cooling requirements, for exam pie, a single cooling system that can adjust between large heat transfer loads as well as small heat transfer loads.

In addition, efficient use of a condenser can be important given the nature of phase change process, the amount of vaporized fluid can vary depending on workload, however, a condenser should be able to condense vaporized cooling fluid under higher loads. Further, abnormal scenarios can also occur in an IT environment.

Some existing cooling systems may not be capable of supporting large variations in evaporation and condensation in an efficient manner, especially in high density applications, which can have high thermal loads. Significant variations of power density may result in complex variations of the vapor generation rate (evaporation), condensation, liquid return, as well as the liquid demand.

BRIEF DESCRIPTION OF THE DRAWINGS

The aspects are illustrated byway of example and not by way of limitation in the figures of the accompanying drawings in which like references indicate similar elements. It should be noted that references to "an" or "one" aspect of this disclosure are not necessarily to the same aspect, and they mean at least one. Also, in the interest of conciseness and reducing the total number of figures, a given figure may be used to illustrate the features of more than one aspect, and not all elements in the figure may be required fora given aspect.

DETAILED DESCRIPTION

Figure 1:
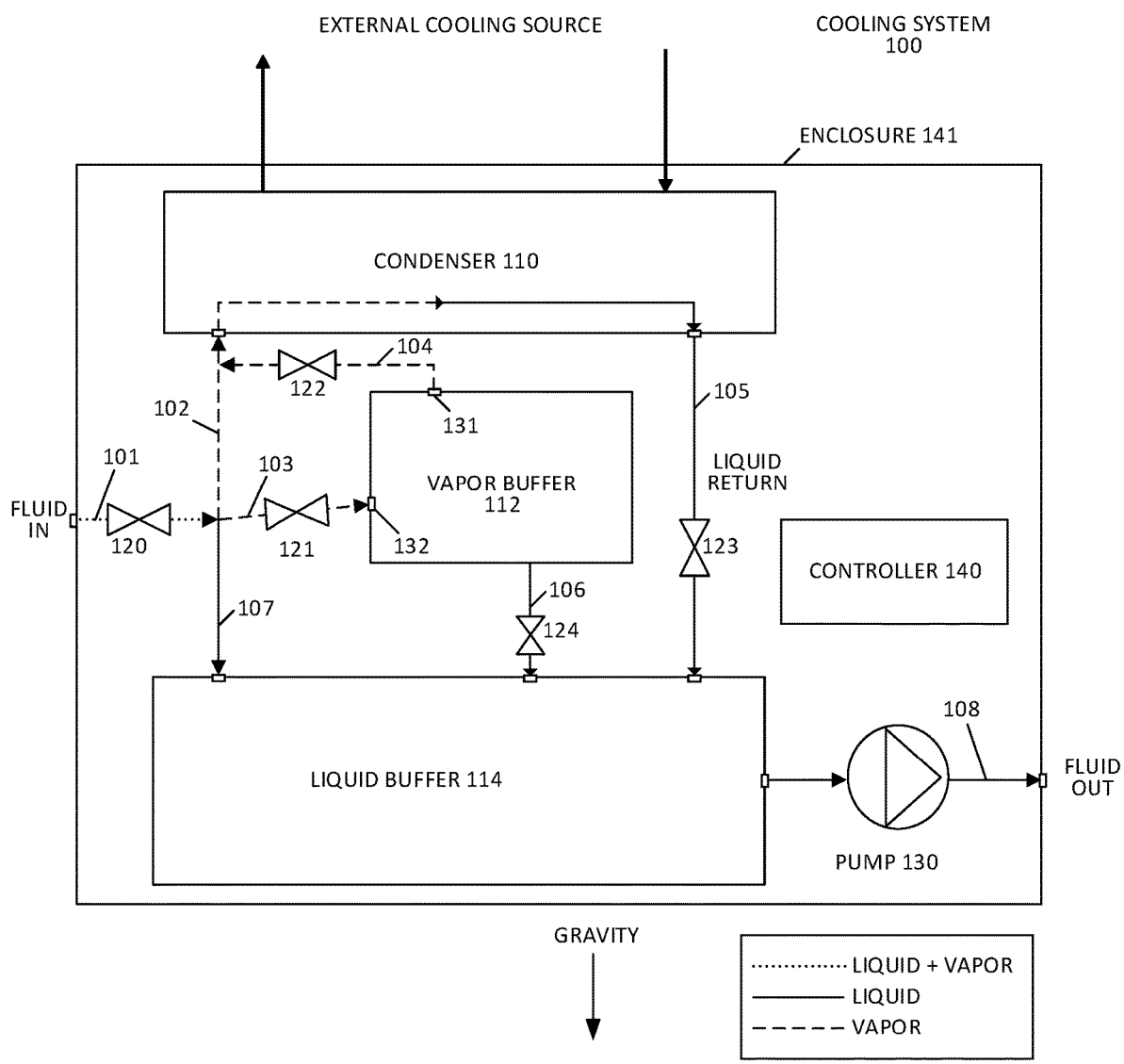
FIG. 1 shows an example cooling system according to some embodiments.

Several aspects of the disclosure with reference to the appended drawings are now explained. Whenever the shapes, relative positions and other aspects of the parts described in a given aspect are not explicitly defined, the scope of the disclosure here is not limited only to the parts shown, which are meant merely for the purpose of illustration. Also, while numerous details are set forth, it is understood that some aspects may be practiced without these details. In other instances, well-known circuits, structures, and techniques have not been shown in detail so as not to obscure the understanding of this description. Furthermore, unless the meaning is clearly to the contrary, all ranges set forth herein are deemed to be inclusive of each range's endpoints.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

As described, there are issues that arise with two phase cooling systems that can be improved upon. A full architectural design for a cooling system can be implemented for deploying two phase cooling solutions for high density racks for high performance computing (HPC) workload and artificial intelligence (AI) workload.

A cooling system can have a multiple buffer system including a vapor buffer and a liquid buffer. A full system buffering design accommodates power load and coo ling capacity variations, as well as variations introduced by abnormal operating scenarios. In some embodiments, a cooling system is integrated with architecture of an IT facility (e.g., an IT room). The cooling system can include multiple operational loops of the cooling fluid, and/or separation of two phase coolant for improved system efficiency.

In some embodiments of the present disclosure, a cooling system includes two buffering units which are used for cooling the high power density racks. A first buffering unit is a vapor buffer and the second buffering unit is a liquid buffer. The two buffering units are used for storing and buffering the variations in the change rate of evaporation and condensation of the cooling fluid, especially when they are out of balance (e.g., one is larger than another). The operation of the buffering units in the cooling system constrains the system's liquid supply and return to remain under desirable parameters even under variations in power generation of IT equipment and external cooling capacities of different condensers.

The connections and design of the fluid channels that connect the components of the cooling system enable the two phase fluid to operate efficiently. The fluid is either directed to the load (in liquid form) or directed to a condenser (in vapor form). The unit can be integrated with an IT rack in either a close loop manner or an open loop manner, to fit into different data center facility level architectures.

In some embodiments, a cooling system includes an input channel from which a fluid enters the cooling system and an output channel from which the fluid exits the cooling system. The system includes a vapor buffer, and a liquid buffer fluidly. The liquid buffer is connected to i) the input channel, and ii) an output of a condenser (or, in the case where the condenser is external to the cooling system, a port that is attachable to the output of the condenser). A plurality of vapor buffer valves are arranged in fluid channels that are located i1) between the vapor buffer and the input channel, and ii1) between the vapor buffer and an input of the condenser (or, in the case where the condenser is external to the cooling system, a port that is attachable to the input of the condenser).

The plurality of vapor buffer valves can be controlled to i2) in a first mode, fluidly disconnect the vapor buffer from the input channel, and ii2) in a second mode, connect the vapor buffer to the input channel and disconnect the vapor buffer from the input of the condenser or the port that is attachable to the input of the condenser.

In such a manner, under normal operation, the fluid can be separated into a liquid loop and a vapor loop. Depending on the current thermal load and/or the condensing capabilities of the condenser, the system can operate under different modes to direct vapor to the vapor buffer when needed. In some embodiments, the system can operate with two modes (a normal mode and a vapor buffering mode), while in other embodiments, the system can operate with three modes (a normal mode, a vapor buffer mode, and a vapor discharge mode).

In the case where the system operates under two modes, a first mode is a normal mode and also a vapor buffer discharge mode where the vapor buffer does not take any vapor in, but can discharge vapor to the condenser. In a second mode, which is a vapor buffer mode, the vapor buffer takes in vapor but does not discharge vapor to the condenser.

In the case where the system operates under three modes, in a first mode, which is a normal mode, the vapor buffer is isolated from the input channel and condenser as well as the condenser. In a second mode, which is a vapor buffer mode, the vapor buffer fills with vapor. In a third mode, which is a vapor buffer discharge mode, the vapor buffer discharges vapor into the condenser but does not take in vapor.

FIG. 1 shows a cooling system 100 according to some embodiments. The cooling system can be packaged within an enclosure 141, thus sharing a common, portable body. The system includes a vapor buffer 112 and a liquid buffer 114. The vapor buffer 112 can be a chamber that holds vapor. Similarly, the liquid buffer 114 can be a chamber that holds liquid. Either can have a variety of volumetric shapes such as, for example, a bean, a sphere, a cube, or a rectangular box. The volume of the buffers can vary based on application, but should have sufficient capacity to provide buffering to the cooling system 100, e.g., holding more fluid than standard conduits and pipe fitting components. In some embodiments, the liquid buffer 114 and/or the vapor buffer 112 has a capacity of greater than 1 liter(L), 2 L, 5 L, 10 L, or 100 L. In some embodiments, the vapor buffer 112 or the liquid buffer 114 is an enclosed tank and nota standard pipe fitting or pipe.

A two phase fluid enters the cooling system 100 through input channel 101. In some embodiments, an input valve 120 is located in the input channel, such that it is in line with the input channel 101 and can allow or prevent the flow of fluid through the input channel 101. The input valve 120 can open under normal operating conditions and close under maintenance or fault conditions. The valve state (open or closed) can be manual and/or controlled by a controller.

At the input channel, the fluid be part liquid and part vapor. Fluid channels such as 107, 103, and 102 separate the fluid and direct the fluid to separate components. The liquid travels to the liquid buffer 114 through a liquid section 107 of the fluid channels that fluidly connects the input channel 101 directly to the liquid buffer 114. The fluid channel 107 can be sloped downward (e.g., straight down as shown, or at an angle) relative to gravity. This liquid section 107 can be without valves so that the liquid buffer 114 is always active and receiving liquid from the input channel 101, because the liquid is pumped to the load from the liquid buffer 114.

Vaporized fluid (vapor) can rise up directly to the condenser 110 through a vapor section 102 of the fluid channels 107, 103, and 102. The vapor section 102 of the fluid channels 107, 103, and 102 can extend upward (e.g., vertically or at a slope) from the input channel 101 to receive vapor but not liquid, thereby separating the vapor from the liquid. Additionally, the vapor can travel through a vapor buffer section 103 of the fluid channels 107, 103, and 102 to a vapor buffer 112. The vapor buffer section 103 can also extend upward (e.g., vertically or at a slope) from the input channel 101, to promote separation of the vapor and the liquid. The input channel 101 can be horizontal or flat, (e.g., roughly perpendicular to gravity). A valve 121 can be arranged in section 103 to allow or prevent the flow of vapor to the vapor buffer 112. In the FIG. 1, a dotted line shows a mix of vapor and fluid, a dash line shows the flow of vapor and the solid line shows the liquid flow. In some embodiments, an input 132 of the vapor buffer 112 is located below an output 131 of the vapor buffer 112, to promote circulation of vapor into the vapor buffer 112 from the vapor buffer section 103 and out of the vapor buffer 112 into the condenser 110.

Vapor can flow from the vapor buffer 112 to the condenser 110, there by discharging the buffered vapor, through a second vapor buffer section 104 that connects the vapor buffer 112 to an input of the condenser 110 (or, when the condenser is external to the cooling system 100, a port 603 that is attachable to the input of the condenser). The flow in through this second vapor buffer section 104 can be controlled by a vapor buffer discharge valve 122.

Fluid, in liquid form, flows through a buffer channel 106 that fluidly connects the vapor buffer 112 with the liquid buffer 114. In this manner, liquid that inadvertently builds up in the vapor buffer 112 can drain to the liquid buffer 114. In some embodiments, a buffer valve 124 is located in the buffer channel 106 to regulate flow between the vapor buffer 112 and the liquid buffer 114. In some embodiments, this valve 124 is left open under normal operations and closed in cases where vapor in the vapor buffer 112 reaches a threshold such that vapor is at risk of flowing down to the liquid buffer 114. In some embodiments, the buffer channel 106 does not include a valve.

The liquid buffer 114 is fluidly connected to an output of the condenser 110 (or a port 602 that is attachable to the output port of the condenser) through a condenser output channel 105. A valve 123 can be located in the output channel 105 to regulate the fluid flow from the condenser 110 to the liquid buffer 114. The fluid at this point has been condensed by the condenser 110 such that it is in liquid form. In some embodiments, a pump 130 is connected to the output channel 108. The pump 130 draws the fluid out of the liquid buffer 114 to exit the cooling system 100 through the output channel 108. Thus, a pump 130 can be used on the liquid supply side for pumping the liquid fluid to the load.

It should be understood that, in some embodiments, the cooling system 100 shows a representation of the relative locations of the components relative to gravity. The liquid buffer 114 can be located below the vapor buffer 112 and the input channel 101 to promote separation of the fluid and to receive the liquid form of the fluid from the input channel 101. The vapor buffer 112 can be located above the liquid buffer 114 and connect with the input channel 101 through rising and/or sloping fluid channel (e.g., section 103) to promote separation of the fluid and to receive the vapor form of the fluid. A rising and/or sloping fluid section 102 can channel the vapor form of fluid to a condenser 110 which is also above at least partially above the input channel 101 and the liquid buffer 114. The loop section 104 may also implemented as a sloping channel. Channels 106 and 105 connect the vapor buffer 112 and condenser 110 to the liquid buffer 114, respectively, in a downward and/or sloping fluid channel, to promote separation of the liquid from fluid in the vapor buffer 112 and the condenser 110, and to take the liquid from the condenser 110 and the vapor buffer 112 into the liquid buffer 114. Thus, the system components are arranged and interconnected to promote a natural separation and rejoining of vapor and liquid forms of the fluid, by using gravity.

Figure 2:
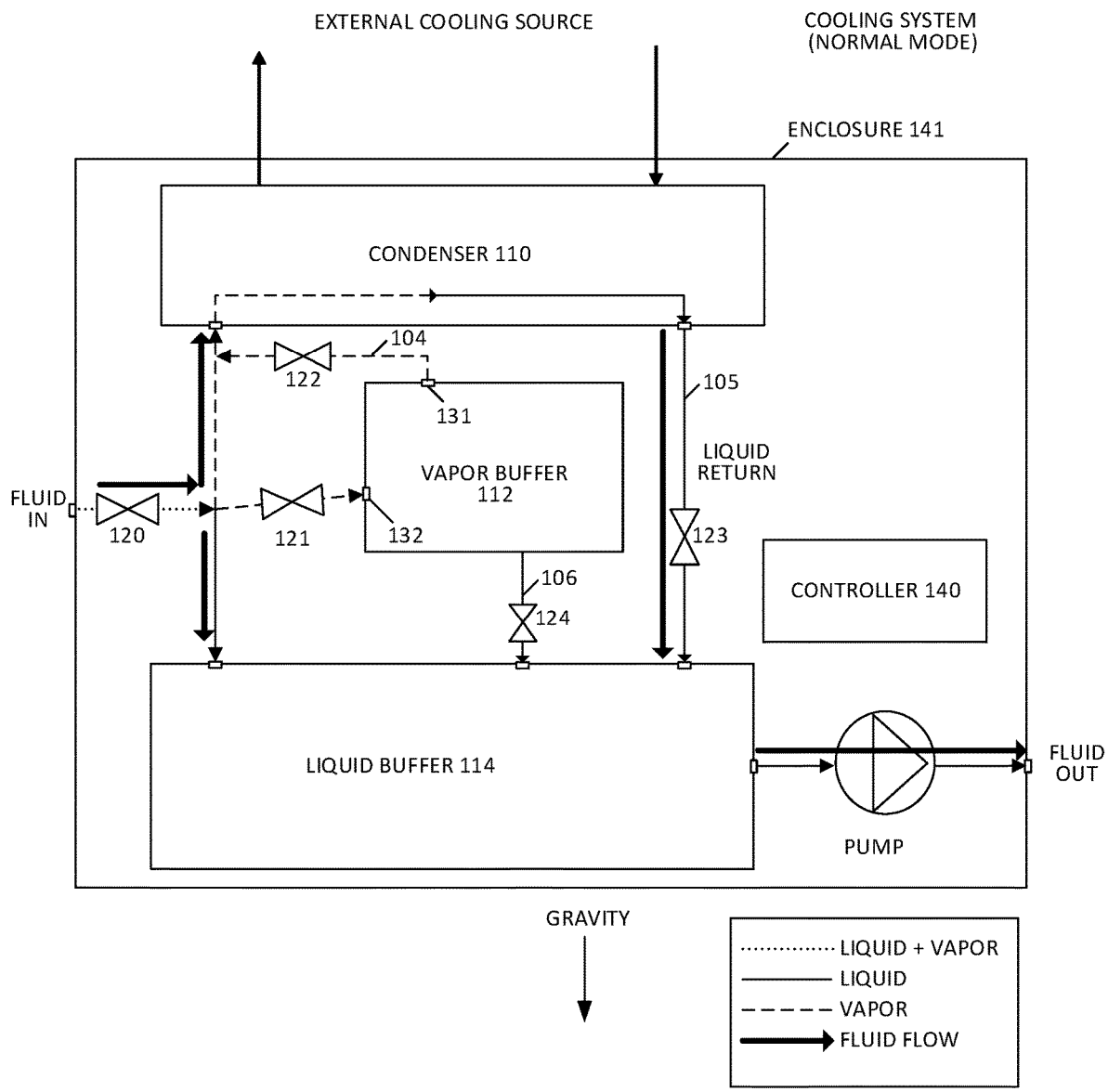
FIG. 2 shows an example cooling system operating under normal according to some embodiments.

FIG. 2 shows a normal operating mode of the cooling system 100 according to some embodiments. The thick solid black lines with arrows show which fluid channels are active, and the flow of the fluid through the cooling system 100. In this normal mode, the vapor travels up to the condenser 110 directly and liquid falls into the liquid buffer 114. Liquid fluid is contained within the liquid buffer 114 and a pump 130 can be used to pull the fluid out of the liquid buffer 114 to a load (e.g., an IT rack). In this normal mode, valve 121 is closed to prevent vapor from flowing to the vapor buffer 112. This is because the condenser 110 is deemed to be capable of condensing the amount of vapor presently being received by the cooling system 100. Valve 122 can be closed to prevent vapor flow from the vapor buffer 112 to the condenser 110, if any vapor is stored in the vapor buffer 112. Further, unless stated otherwise, valve 120 and valve 123 are in the open position (under the different modes) to allow fluid to enter the cooling system 100 and to let liquid flow from the condenser 110 to the liquid buffer 114. Further, in some embodiments (e.g., where the cooling system 100 operates with two modes), valve 122 can be open under normal mode, to discharge the vapor from the vapor buffer 112, or when the vapor is fully discharged from the vapor buffer 112 and valve 121 is closed. This can simplify operation so that the cooling system 100 operates with two modes rather than three modes.

Figure 3:
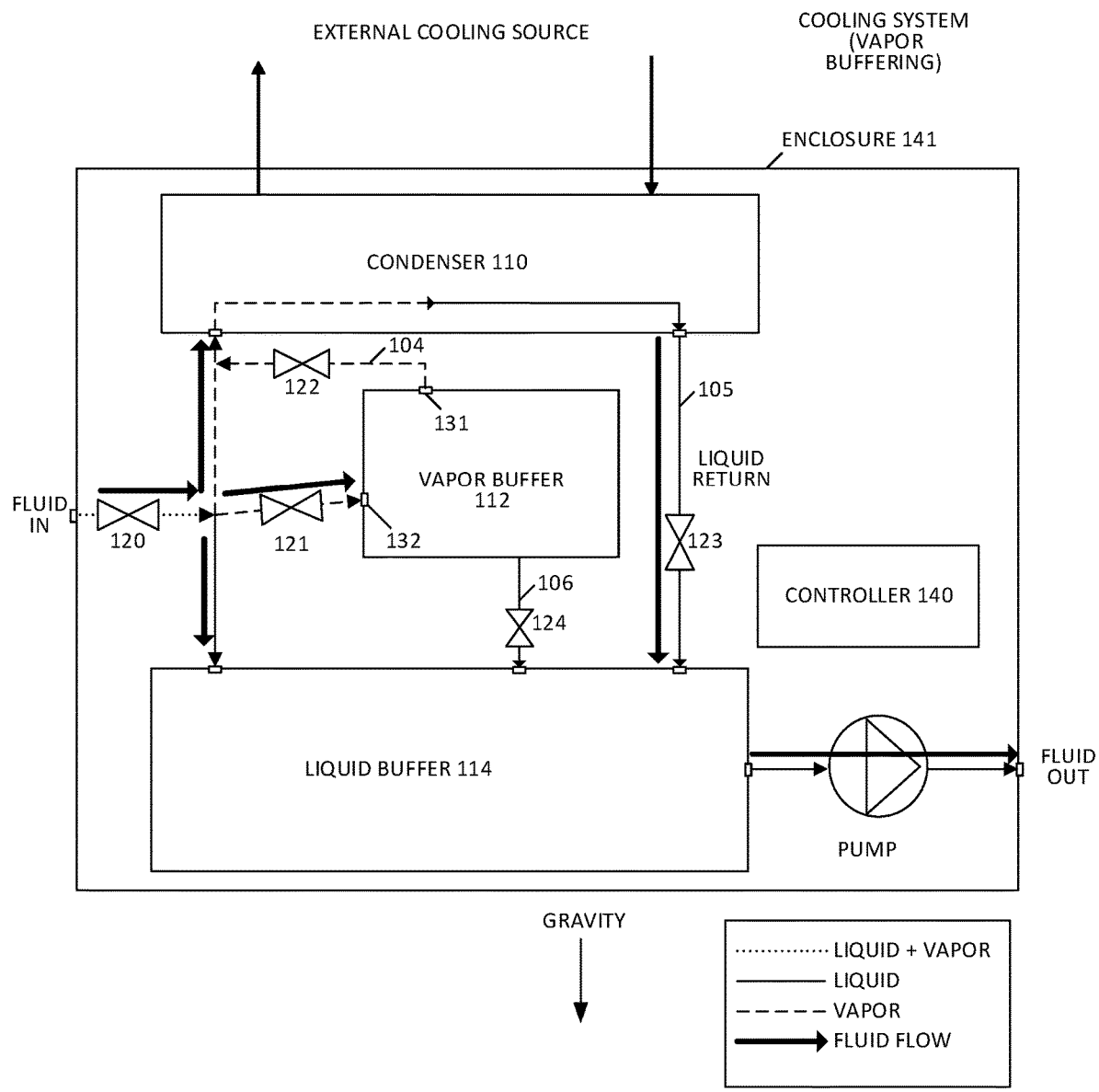
FIG. 3 shows an example cooling system operating under vapor buffering mode according to some embodiments.

FIG. 3 shows the cooling system 100 in vapor buffer mode, where vapor is partially directed into the vapor buffer 112 and stored in the vapor buffer 112. The vapor buffer 112 is injected into the cooling process in response to when the evaporation and condensation of the fluid is not balanced. This imbalance can be determined based on cooling capacity variations of the condenser 110 and/or heat generation variations in the load. In vapor buffer mode, vaporized fluid enters both the condenser 110 and the vapor buffer 112. The vapor buffer 112 stores some of the vapor in the cooling system 100 to compensate for the condenser 110's inability to condense all of the vaporized fluid entering the cooling system 100 through the input channel 101. In this mode, valve 121 is open to allow the vapor to flow into the vapor buffer 112. Valve 122 is closed to isolate the vapor buffer 112 from the condenser 110. It should be noted that, in the context of the connections between the condenser 110, vapor buffer 112, liquid buffer 114, and other system components, the terms 'connect' and 'disconnect' refer to connection and isolation of the cooling fluid used by the cooling system 100.

Figure 4:
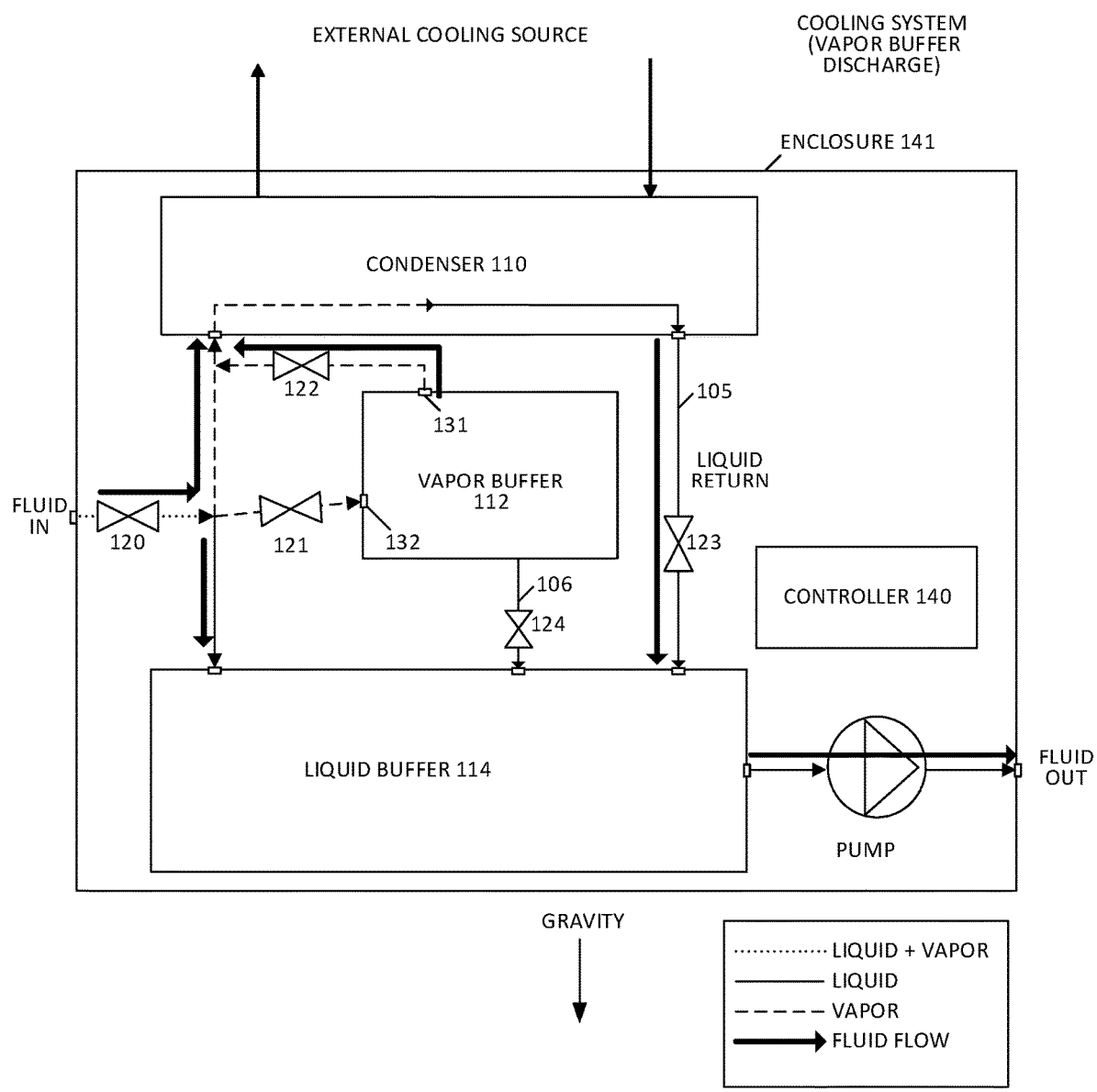
FIG. 4 shows an example cooling system operating under vapor discharging mode according to some embodiments.

FIG. 4 shows the cooling system 100 in vapor discharge mode in some embodiments. The vapor stored in the vapor buffer 112 is released to the condenser 110. The condenser 110 condenses the vaporized fluid to liquid form. In this mode, the valve 121 is closed to prevent vapor from entering the vapor buffer 112 from the input channel 101. Valve 122 is open, thereby allowing vapor that is stored in the vapor buffer 112 to rise to the condenser 110. Thus, when the condenser capability is deemed to be greater than the current vapor load, the cooling system 100 can discharge the vapor to better utilize the condenser 110.

Thus, based on the buffering and discharging modes of the cooling system 100, it can be seen that the cooling system 100 uses the buffers to improve utilization of the condenser 110. A smaller condenser can handle larger thermal loads because vapor is buffered when the thermal load evaporates the fluid beyond the condenser's capacity. When the thermal load decreases or cooling capacity increases, the buffered vapor can be directed to and condensed by the condenser 110. The liquid buffer 114 accommodates for variances of the liquid return from the condenser 110 as well as providing a draining point for the vapor buffer 112 to drain liquid that inadvertently collects in the vapor buffer 112, into the liquid buffer 114.

In some embodiments, the plurality of vapor buffer valves 121, 122 are controlled to be in the normal mode (e.g., a first mode) when the a) an evaporation of the fluid (e.g., in the input channel 101) and/or b) when the condensing of the fluid does not satisfy a threshold. In some embodiments, the threshold can be based on the evaporation of the fluid and/or the condensing ability of the condenser 110. For example, the threshold can be a ratio of, or a difference between, the evaporation of the fluid and condensation by the condenser 110.

In some embodiments, the threshold can be satisfied when the evaporation of the fluid exceeds the condensation of the condenser 110, which can be expressed mathematically, for example, as evaporation/condensation. Thus, in this example, when the condensing ability of the condenser 110 is greater than the evaporation of the fluid, the threshold is not satisfied and the plurality of vapor buffer valves 121, 122 are controlled to place the cooling system 100 in normal mode. In some embodiments, the threshold can be a range "a", for example, (evaporation+−a/2)/condensation.

The plurality of vapor buffer valves (e.g., valves 121 and 122) are controlled to be in the vapor buffer mode (e.g., a second mode) when a) an evaporation of the fluid in the input channel 101 and/or b) when the condensing of the fluid satisfies a threshold. The threshold can be the same as the threshold used for normal mode, or a different threshold.

The evaporation of the fluid can be determined based on one or more sensed pressure sin fluid channels 101, 102, 103, 107. A pressure sensor, located in the input channel 101 and/or other fluid channels 102, 103, 107 of the cooling system 100, can be used to sense the pressure in the fluid channels 102, 103, 107, from which the evaporation of the fluid can be derived through known means (e.g., through a look-up table and/or a mathematical formula that relates pressure to evaporation). The cooling system 100 can measure one or more pressures, since variations in evaporation and condensation impact the static pressure in a given channel. The derivation of evaporation and/or condensation can be based on one or more calculations that are based on system specifications and/or collected test data that correlates pressure to evaporation and/or condensation under different conditions. These calculations and test data can be determined based on test and experimentation. In some aspects, one or more reference values that represent one or more thresholds can be preset in the cooling system 100.

In some embodiments, as shown in FIG. 1 through FIG. 4, a controller 140 can control the state of the valves (e.g., valves 120, 121, 122, 123, and 124). The valves 120, 121, 122, 123, 124 can have motors, solenoids, or other known actuation mechanisms that are capable of being commanded open, closed, or partially open/closed by the controller 140.

In some embodiments, the controller 140 can include a computer that is configured to perform logic operations to open and close the valves 120, 121, 122, 123, 124 as described. Alternatively, or additionally, the controller 140 can include analog and digital electronic circuitry that can perform the logic operations. The controller 140 can receive sensed input from which the evaporation and condensation of the fluid can be derived. The controller 140 can then determine whether or not one or more thresholds are satisfied so that the controller 140 can command the valves 120, 121, 122, 123, 124 open or closed, depending on the mode, as described. Control of the valves 120, 121, 122, 123, 124 can be performed through commands that are communicated from the controller 140 to each valve via electrical signals (e.g., outputs of the controller), and/or known communication protocols (e.g., RS232, CAN bus, ModBus etc.).

Figure 5:
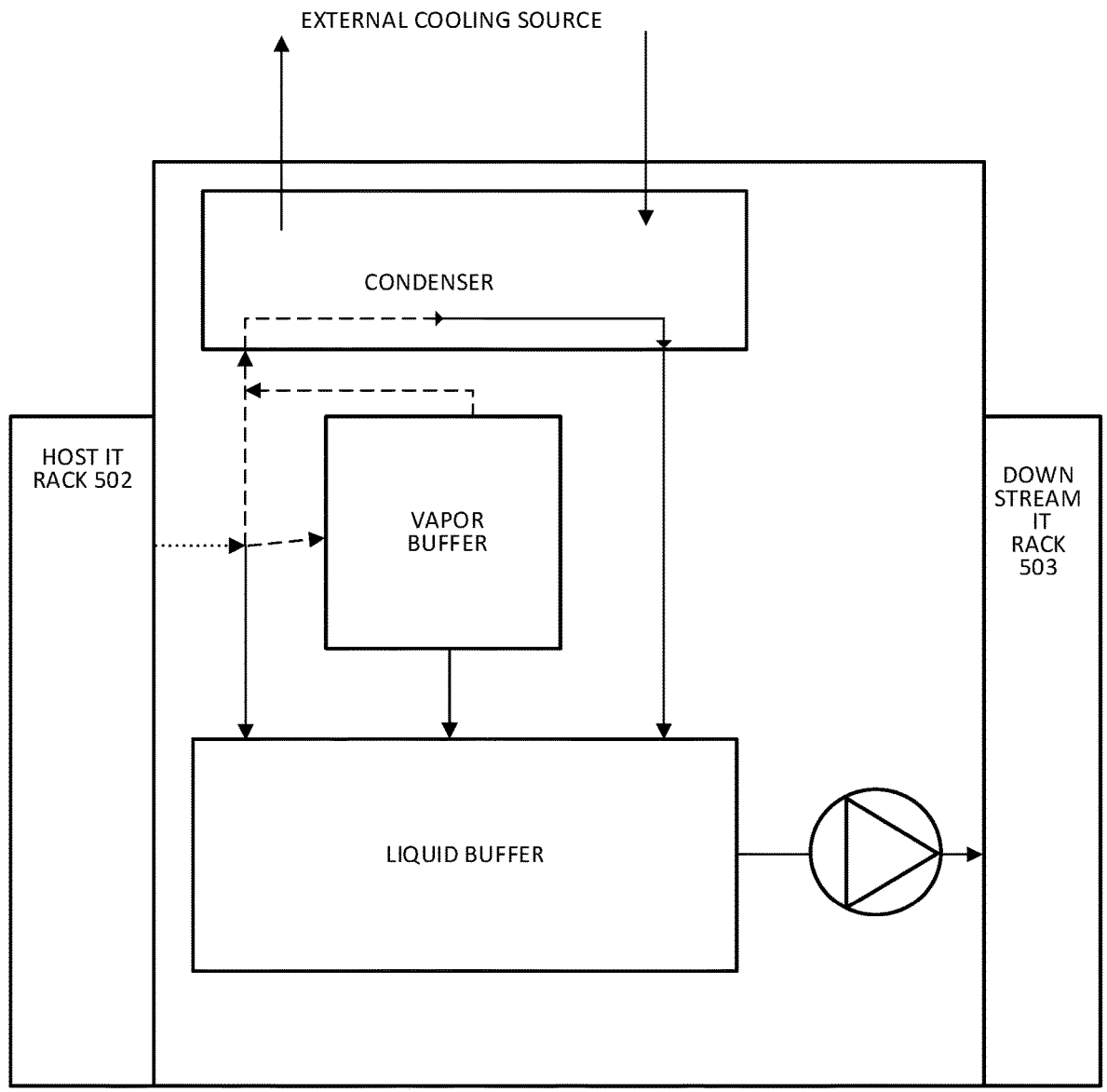
FIG. 5 and FIG. 6 show examples of one or more cooling systems arranged with IT racks in an open loop arrangement according to some embodiments.

FIG. 5 shows a manner in which the cooling system 100, in some embodiments, can be connected with other IT equipment such as a host IT rack 502 and a downstream IT rack 503. The input channel 101 of the cooling system can connect to an output of a host IT rack. The fluid received from the host IT rack 502 can be in both liquid and vapor form, because the fluid has extracted thermal energy from the host IT rack 502. The cooling system 100 can cool the fluid in a normal mode, a vapor buffer mode, or a vapor discharge mode, as described in other sections. The vapor is condensed to liquid and then circulated out to a downstream IT rack 503 (which is separate from the host IT rack 502). As such, a first IT rack 502 is fluidly connected to the input channel 101 of a cooling system 100 and a second IT rack 503 is fluidly connected to the output channel 108 of the same cooling system 100. This pattern of IT rack to cooling system to IT rack to cooling system can be repeated to create a chain of IT racks and cooling systems connected in series. Such a configuration can be described as an open loop configuration.

Figure 6:
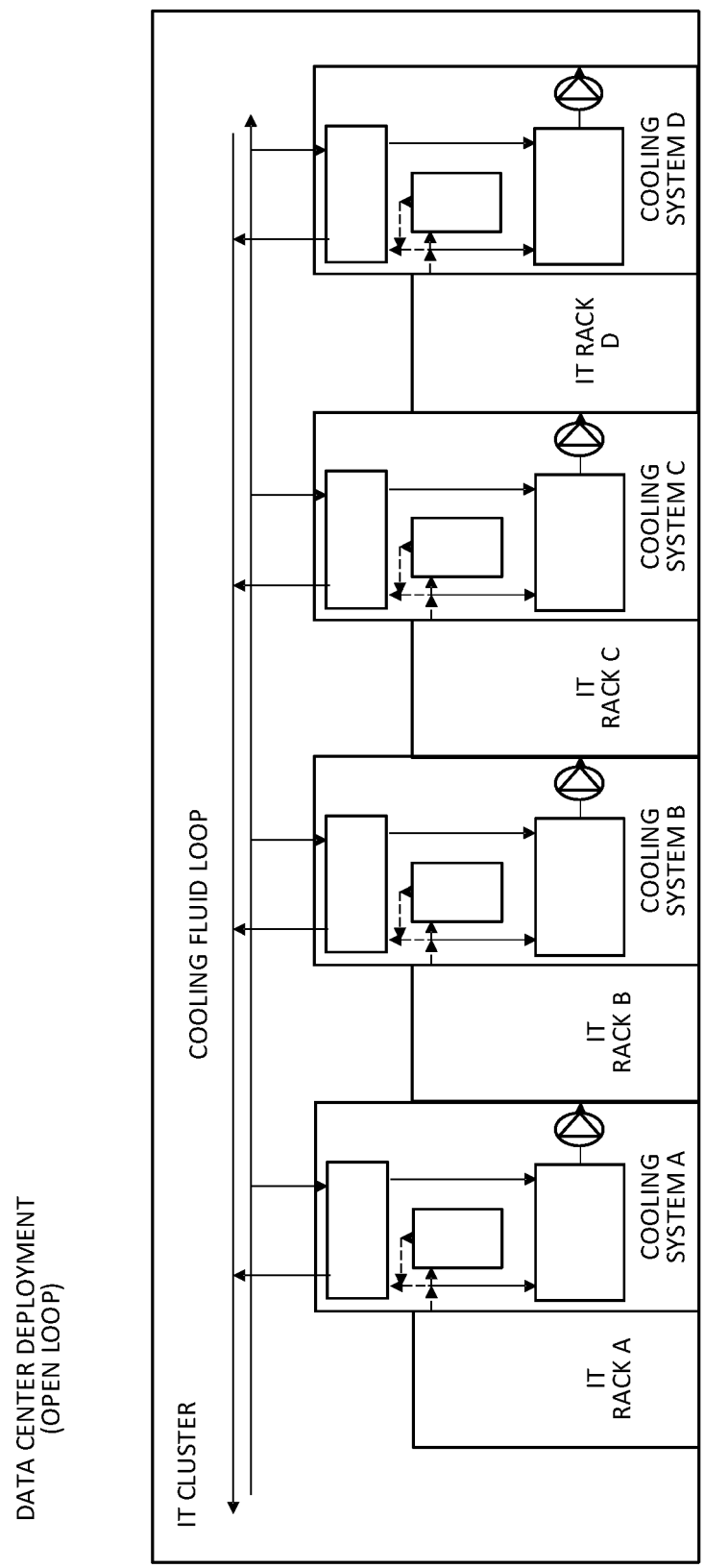

For example, FIG. 6 shows a side view IT racks and cooling systems that are connected in an open loop configuration. The cooling fluid loop is used for distributing external cooling fluid to the condensers 110 of each cooling system. An IT rack A has fluid (which can be a mix of liquid and vapor) that is directed to cooling system A. The cooling system cools the fluid and directs the fluid, in liquid form, and directs the fluid to IT rack B. The fluid extracts thermal energy from IT rack B and, in the process, some of the fluid can vaporize. The fluid is then directed to cooling system B, and so on, down a chain. It should be understood that, in some embodiments, the 'open loop' configuration can form a complete loop. For example, the output channel of cooling system D can be connected to an inlet of IT rack A, although not shown in the figure.

Figure 7:
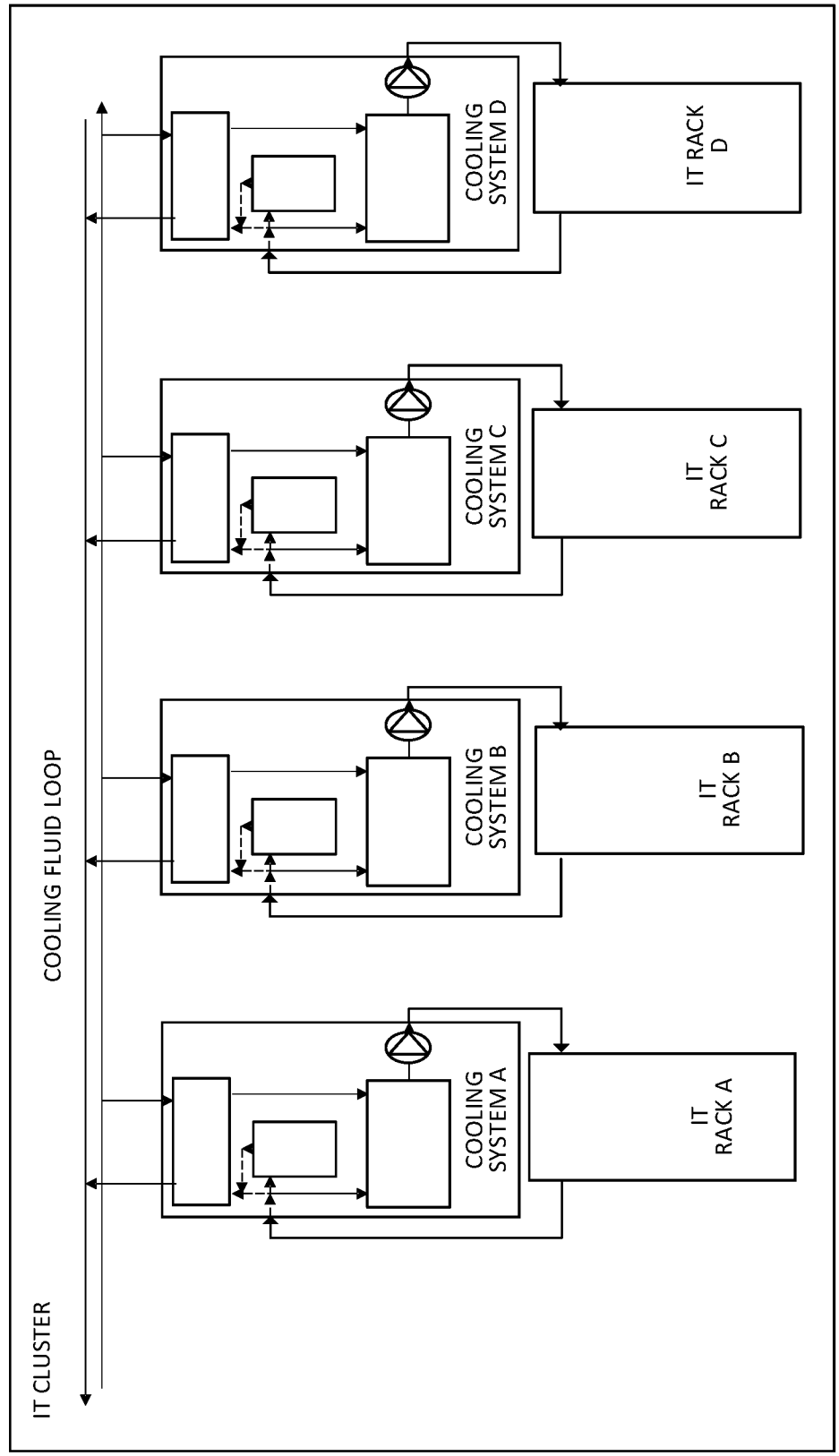
FIG. 7 shows an example of cooling systems arranged with IT racks in a closed loop arrangement according to some embodiments.

Alternatively, as shown in FIG. 7, each cooling system can be connected to a dedicated IT equipment. In such a case, the same IT rack is fluidly connected to the input channel 101 and the output channel 108 of a cooling system. An IT room can have multiple cooling systems connected to various other IT equipment. It should be understood that the arrangement of the IT rack as well as each cooling system can vary based on application, including a mix of open and closed loop connections. The cooling system can be integrated to the rack as part of the rack, or a partial unit of the rack. Some drawings may show the cooling system having a larger foot print and form factor than the IT rack for illustration purposes only.

Figure 8:
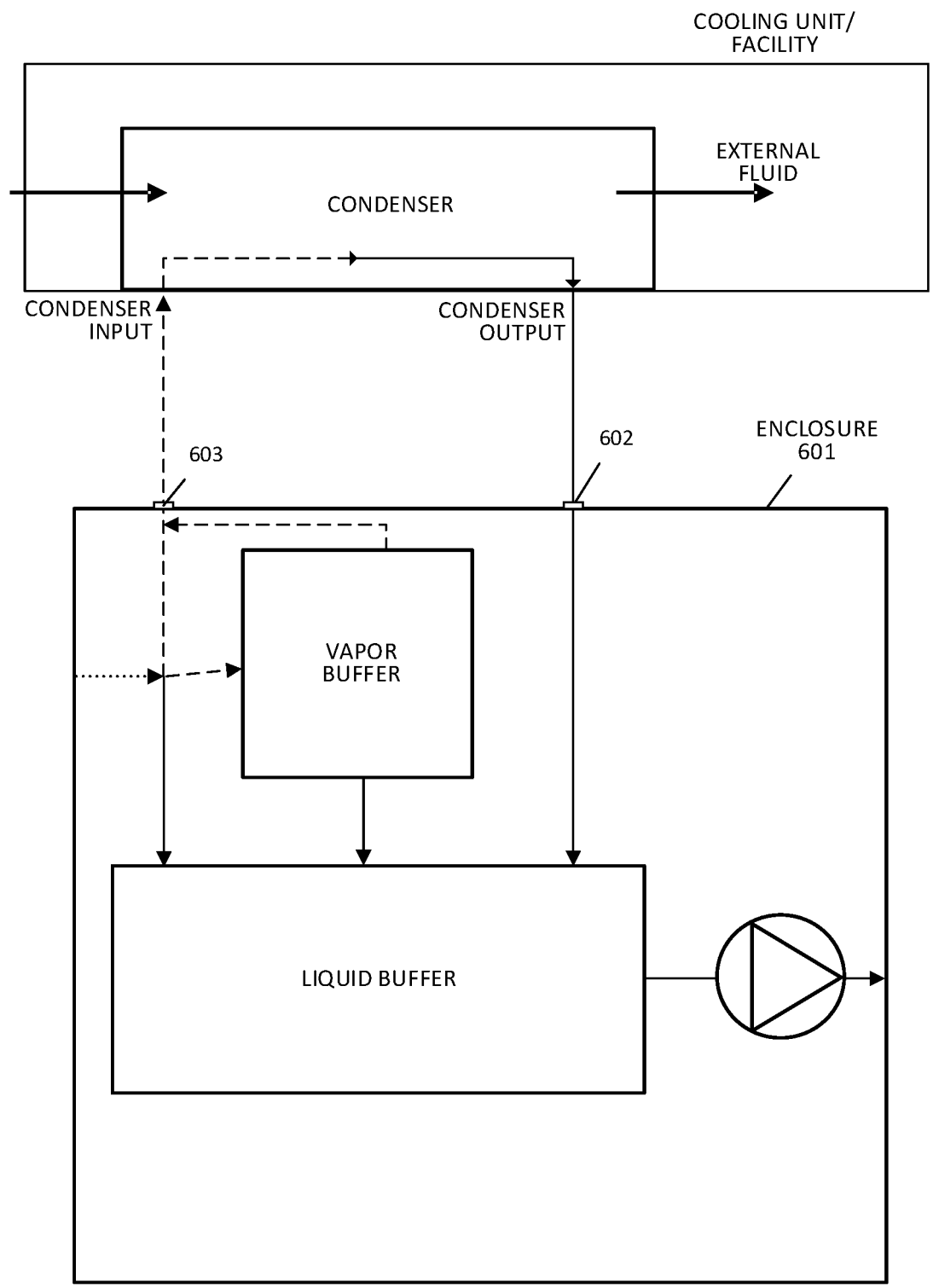
FIG. 8 shows an example of a cooling system that connects to an external condenser according to some embodiments.

In some embodiments, as shown in FIG. 8, the condenser unit is separate from the cooling system and can be described as being integral to a cooling facility unit. In this embodiment, the input channel 101, the vapor buffer 112, the liquid buffer 114, the plurality of vapor buffer valves 121, 122, the port 602 that is attachable to the output port of the condenser, and the port 603 that is attachable to the input port of the condenser are housed in or on a common enclosure 601 of the cooling system. The condenser unit is located external to the cooling system and its enclosure 601. In this arrangement, the cooling system can be located in the IT cluster side and the condenser unit can be implemented in the cooling facility side. IT cluster side can be understood as integrated together within enclosure 601 that is located adjacent to the racks as shown in FIG. 5. Cooling facility side can refer to the top section above the enclosures 601.

In FIG. 8, the condensing unit including its condenser is located above the enclosure 601 in the cooling facility section. In such a design, the two phase fluid will pass both the IT cluster and facility side. In the embodiment that the condenser is packaged in a condenser enclosure, the two phase fluid will only recirculate within the IT cluster and external fluid will pass both the facility side and the IT cluster, since the condenser is in the condenser enclosure. In the cooling facility side, the architecture is simple. Cooling fluid can be used as an external cooling source to cool the fluid that passes through the condenser. The external fluid and the cooling fluid can be isolated within the condenser. Connection lines such as conduit and/or hoses can be used to connect the condenser to the ports 603 and 602 of the cooling system, thereby providing vapor flow to the condense rand liquid flow from the condenser to the liquid buffer 114. In some embodiments, the cooling unit, which includes the condenser, can be one module, and the IT cluster can be a separate module.

Figure 9:
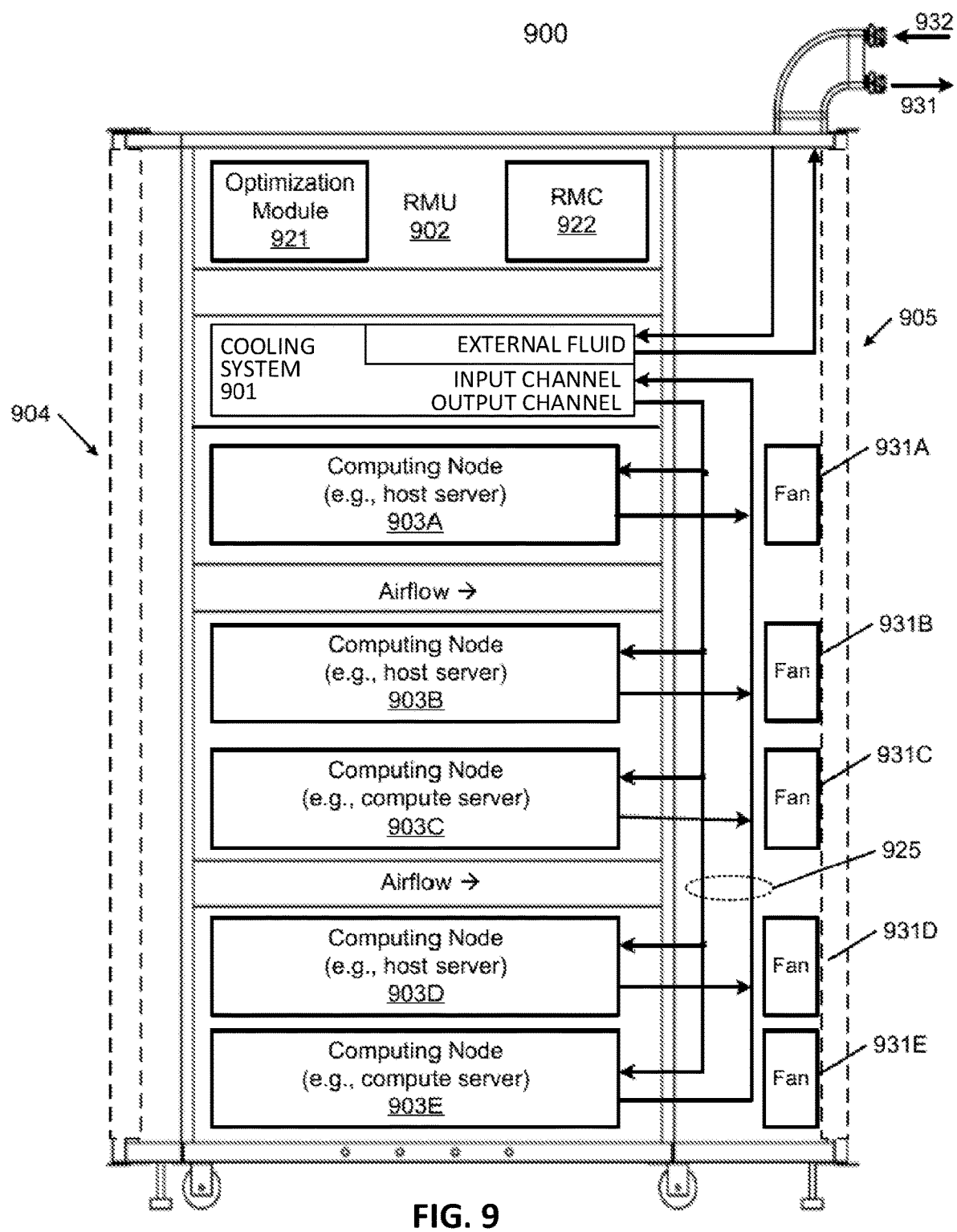
FIG. 9 shows an example of an IT rack with cooling system according to some embodiments.

FIG. 9 is a block diagram illustrating an example of an IT rack having an integrated cooling system, according to some embodiments, however, it should be understood that different variations can be implemented. IT rack 900 may contain one or more servers, each server having one or more processing units attached to a bottom of any of the cooling devices described above. The rack 900 includes, but is not limited to, a cooling system 901, rack management unit (RMU) 902 (optional), and one or more server blades 903A-903E (collectively referred to as server blades 903). Cooling system 901 can be any embodiment of the cooling system described herein.

Server blades 903 can be inserted into an array of servers lots respectively from front end 904 or backend 905 of IT rack 900. Note that although there are only five server blades 903A-903E shown here, more or fewer server blades may be maintained within IT rack 900. Also note that the particular positions of cooling system 901, RMU 902, and server blades 903 are shown for the purpose of illustration only; other arrangements or configurations of may also be implemented. Note that rack 900 can be either open to the environment or partially contained by a rack container, as long as the cooling fans can generate airflows from the front end to the backend.

In addition, for each of the server blades 903, a fan module is associated with the server blade. In this embodiment, fan modules 931A-931E, collectively referred to as fan modules 931, and are associated with server blades 903A-903E respectively. Each of the fan modules 931 includes one or more cooling fans. Fan modules 931 may be mounted on the backends of server blades 903 to generate airflows flowing from front end 904, traveling through the airspace of the sever blades 903, and existing at backend 905 of rack 900.

A condenser of the cooling system 901 can be coupled to external liquid supply/return lines 931-932 to form a primary loop. In some embodiments, if the condenser is external to the IT rack, then the external fluid supply/return lines can connect to ports (e.g., ports 602, 603 as shown in FIG. 8) of the cooling system 901. The connectors coupled to the external liquid supply/return lines 931-932 may be disposed or mounted on backend 905 of the rack 900. In some embodiments, the liquid supply/return lines 931-932 are coupled to a set of room manifolds, which are coupled to an external heat removal system, or extremal cooling loop. The input and output channels of the cooling system can be coupled to liquid manifold 925 to form a secondary loop, which may include a supply manifold to supply cooling liquid to server blades 903 and a return manifold to return warmer liquid back to the cooling system 901.

Each of server blades 903 may include one or more IT components (e.g., central processing units or CPUs, graphical processing units (GPUs), memory, and/or storage devices). Each IT component may perform data processing tasks, where the IT component may include software installed in a storage device, loaded into the memory, and executed by one or more processors to perform the data processing tasks. At least some of these IT components may be attached to the bottom of any of the cooling devices as described above. Server blades 903 may include a host server (referred to as a host node) coupled to one or more compute servers (also referred to as computing nodes, such as CPU server and GPU server).

The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the performance computing nodes or compute servers (having one or more GPUs) managed by the host server. The performance compute servers perform the actual tasks, which may generate heat during the operations.

IT rack 900 can further include optional RMU 902 configured to provide and manage power supplied to servers 903, fan modules 931, and cooling system 901. RMU 902 may be coupled to a power supply unit (not shown) to manage the power consumption of the power supply unit. The power supply unit may include the necessary circuitry (e.g., an alternating current (AC) to direct current (DC) or DC to DC power converter, backup battery, transformer, or regulator, etc.) to provide power to the rest of the components of IT rack 900.

In one embodiment, RMU 902 includes optimization module 921 and rack management controller (RMC) 922. RMC 922 may include a monitor to monitor operating status of various components within rack 900, such as, for example, computing nodes 903, cooling system 901, and fan modules 931. Specifically, the monitor receives operating data from various sensors representing the operating environments of IT rack 900. For example, the monitor may receive operating data representing temperatures of the processors, cooling liquid, and airflows, which may be captured and collected via various temperature sensors. The monitor may also receive data re presenting the fan power and pump power gene rated by the fan modules 931 and liquid pump 912, which may be proportional to their respective speeds. These operating data are referred to as real-time operating data. Note that the monitor may be implemented as a separate module within RMU 902.

Based on the operating data, optimization module 921 performs an optimization using a predetermined optimization function or optimization model to derive a set of optimal fan speeds for fan modules 931 and an optimal pump speed for liquid pump 912, such that the total power consumption of liquid pump 912 and fan modules 931 reaches minimum, while the operating data associated with liquid pump 912 and cooling fans of fan modules 931 are within their respective designed specifications. Once the optimal pump speed and optimal fan speeds have been determined, RMC 922 configures liquid pump 912 and cooling fans of fan modules 931 based on the optimal pump speed and fan speeds.

As an example, based on the optimal pump speed, RMC 922 communicates with a pump controller of cooling system 901 to control the speed of liquid pump 912, which in turn controls a liquid flow rate of cooling liquid supplied to the liquid manifold 925 to be distributed to at least some of server blades 903. Therefore, the operating condition and the corresponding cooling device performance is adjusted. Similarly, based on the optimal fan speeds, RMC 922 communicates with each of the fan modules 931 to control the speed of each cooling fan of the fan modules 931, which in turn control the airflow rates of the fan modules 931. Note that each of fan modules 931 may be individually controlled with its specific optimal fan speed, and different fan modules and/or different cooling fans within the same fan module may have different optimal fan speeds.

Note that some or all of the IT components of servers 903 may be attached to any one of the cooling devices described above, either via air cooling using a heatsink or vi a liquid cooling using a cold plate. One server may utilize air cooling while another server may utilize liquid cooling. Alternatively, one IT component of a server may utilize air cooling while another IT component of the same server may utilize liquid cooling.

It should be understood that some features described and shown in the drawings can vary without departing from the scope of the disclosure. For example, the cooling loop design of the cooling facility vary from that shown in the drawings. Further, additional valve or auxiliary units can be added to the cooling system for additional features. Further, different types of valves, e.g., three way valves, can be implemented in the cooling system to achieve the same results. In some embodiments, the controller may adjust opening ratios between completely closed (0%) and completely open (100%) of any of the valves as described herein.

Some embodiments may include a non-transitory machine-readable medium (such as micro electronic memory) having stored thereon instructions, which program one or more data processing components (generically referred to here as a "processor") to perform valve control operations, such as determining which mode to operate in, and/or deriving evaporation rate and/or rate of condensation. In some aspects, the rate of condensation is configurable (e.g., it is stored as a setting in computer readable memory). In some embodiments, some of these operations might be performed by specific hardware components that contain hardwired logic. Those operations might alternatively be performed by any combination of programmed data processing components and fixed hardwired circuit components.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

While certain aspects have been described and shown in the accompanying drawings, it is to be understood that such aspects are merely illustrative of and not restrictive on the broad disclosure, and that the disclosure is not limited to the specific constructions and arrangements shown and described, since various other modifications may occur to those of ordinary skill in the art. The description is thus to be regarded as illustrative instead of limiting.

In some aspects, this disclosure may include the language, for example, "at least one of [element A] and [element B]." This language may refer to one or more of the elements. For example, "at least one of A and B" may refer to "A," "B," or "A and B." Specifically, "at least one of A and B" may refer to "at least one of A and at least one of B," or "at least of either A or B." In some aspects, this disclosure may include the language, for example, "[element A], [element B], and/or [element C]." This language may refer to either of the elements or any combination thereof. For instance, "A, B, and/or C" may refer to "A," "B," "C," "A and B," "A and C," "B and C," or "A, B, and C."

What is claimed is:

1. A cooling system comprising: an input channel configured for a vapor phase and a liquid phase of a fluid to enter the cooling system and an output channel configured for the liquid phase of the fluid to exit the cooling system; a vapor buffer configured to hold the vapor phase of the fluid;
   a liquid buffer configured to hold the liquid phase of the fluid, the liquid buffer downstream of the input channel, and downstream of an output of a condenser or a first port that is attachable to the output of the condenser;
   a first vapor buffer channel downstream of the input channel and upstream of the vapor buffer having a first vapor buffer valve located in the first vapor buffer channel to allow or prevent a flow of the vapor phase from the input channel to the vapor buffer; and
   a second vapor buffer channel downstream of the vapor buffer and upstream of an input of the condenser or a second port that is attachable to the input of the condenser, the second vapor buffer channel arranged higher than the first vapor buffer channel and having a second vapor buffer valve located in the second vapor buffer channel to allow or prevent a flow of the vapor phase from the vapor buffer to the condenser;
   wherein when the cooling system is in a first mode, the first vapor buffer valve is closed, and
   wherein when the cooling system is in a second mode, the first vapor buffer valve is open and the second vapor buffer valve is closed.

2. The cooling system of claim 1, wherein the first vapor buffer channel fluidly connects the input channel to the vapor buffer, through at least a first sloping channel.

3. The cooling system of claim 2, wherein the second vapor buffer channel fluidly connects the vapor buffer to the input of the condenser or the port that is attachable to the input of the condenser, through at least a second sloping channel.

4. The cooling system of claim 1, wherein the liquid buffer is downstream of the input channel without a valve between the input channel and the liquid buffer.

5. The cooling system of claim 1, wherein the liquid buffer is directly connected to the output channel allowing for liquid phase to flow from the liquid buffer directly to the output channel.

6. The cooling system of claim 1, wherein when the cooling system is in the first mode, the second vapor buffer valve is closed.

7. The cooling system of claim 6, wherein the cooling system is in a third mode, the first vapor buffer valve is closed and the second vapor buffer valve is open.

8. The cooling system of claim 1, wherein the first vapor buffer valve and the second vapor buffer valve are controlled to be in the second mode when an evaporation of the fluid in the input channel satisfies a threshold.

9. The cooling system of claim 8, wherein the first vapor buffer valve is controlled to be in the first mode when the evaporation of the fluid does not satisfy the threshold.

10. The cooling system of claim 8, wherein the threshold is a ratio of, or a difference between, the evaporation of the fluid and a condensation of the fluid by the condenser.

11. The cooling system of claim 8, wherein the evaporation of the fluid is determined based on a sensed pressure in at least one of the input channel, the first vapor buffer channel, or the second vapor buffer channel.

12. The cooling system of claim 1, further comprising a pump that is connected to or located in the output channel, wherein the pump is to draw the liquid phase out of the liquid buffer to exit the cooling system through the output channel.

13. The cooling system of claim 1, further comprising an input valve to allow or prevent a flow of the fluid through the input channel, the input valve arranged in line with or located in the input channel.

14. The cooling system of claim 1, further comprising a liquid buffer channel downstream of the vapor buffer and upstream of the liquid buffer, and a liquid buffer valve located in the liquid buffer channel to allow or prevent a liquid flow of the fluid between the vapor buffer and the liquid buffer.

15. The cooling system of claim 1, wherein when the output of the condenser or the first port that is attachable to the output of the condenser is the output of the condenser and the input of the condenser or the second port that is attachable to the input of the condenser is the input of the condenser, the cooling system includes the condenser and is housed in a common enclosure.

16. The cooling system of claim 1, wherein when the output of the condenser or the first port that is attachable to the output of the condenser is the first port that is attachable to the output of the condenser and the input of the condenser or the second port that is attachable to the input of the condenser is the second port that is attachable to the input of the condenser, the input channel, the vapor buffer, the liquid buffer, the first vapor buffer valve, the second vapor buffer valve, the port that is attachable to the output of the condenser, and the port that is attachable to the input of the condenser are housed in or on an enclosure of the cooling system, and the condenser is located external to the enclosure.

17. The cooling system of claim 1, wherein an Information Technology (IT) rack is fluidly connected to the input channel and the output channel of the cooling system.

18. The cooling system of claim 1, wherein a first Information Technology (IT) rack is fluidly connected to the input channel and a second IT rack is fluidly connected to the output channel of the cooling system.

19. An electronic rack of a data center, comprising: a plurality of information technology (IT) equipment; and
   a cooling system coupled to the IT equipment to provide cooling to the IT equipment, wherein the cooling system comprises:
      an input channel configured for a vapor phase and a liquid phase of a fluid to enter the cooling system and an output channel configured for the liquid phase of the fluid to exit the cooling system;
      a vapor buffer configured to hold the vapor phase of the fluid;
      a liquid buffer configured to hold the liquid phase of the fluid, the liquid buffer downstream of connected to the input, channel and downstream of an output of a condenser or a first port that is attachable to the output of the condenser;
      a first vapor buffer channel downstream of the input channel and upstream of the vapor buffer having a first vapor buffer valve located in the first vapor buffer channel to allow or prevent a flow of the vapor phase from the input channel to the vapor buffer; and
      a second vapor buffer channel downstream of the vapor buffer and upstream of an input of the condenser or a second port that is attachable to the input of the condenser, the second vapor buffer channel arranged higher than the first vapor buffer channel and having a second vapor buffer valve located in the second vapor buffer channel to allow or prevent a flow of the vapor phase from the vapor buffer to the condenser;
   wherein when the cooling system is in a first mode, the first vapor buffer valve is closed, and
   wherein when the cooling system is in a second mode, the first vapor buffer valve is open and the second vapor buffer valve is closed.

20. A data center, comprising:
a plurality of electronic racks, each of the electronic racks including one or more information technology (IT) equipment; and
a cooling system coupled to at least one of the electronic racks to provide cooling to the at least one of the electronic racks, wherein the cooling system comprises:
   an input channel configured for a vapor phase and a liquid phase of a fluid to enter the cooling system and an output channel configured for the liquid phase of the fluid to exit the cooling system;
   a vapor buffer configured to hold the vapor phase of the fluid;
   a liquid buffer configured to hold the liquid phase of the fluid, the liquid buffer downstream of the input channel, and downstream of an output of a condenser or a first port that is attachable to the output of the condenser;
   a first vapor buffer channel downstream of the input channel and upstream of the vapor buffer having a first vapor buffer valve located in the first vapor buffer channel to allow or prevent a flow of the vapor phase from the input channel to the vapor buffer; and
   a second vapor buffer channel downstream of the vapor buffer and upstream of an input of the condenser or a second port that is attachable to the input of the condenser, the second vapor buffer channel arranged higher than the first vapor buffer channel and having a second vapor buffer valve located in the second vapor buffer channel to allow or prevent a flow of the vapor phase from the vapor buffer to the condenser;
   wherein when the cooling system is in a first mode, the first vapor buffer valve is closed, and
   wherein when the cooling system is in a second mode, the first vapor buffer valve is open and the second vapor buffer valve is close.

* * * * *